United States Patent [19]
Jung

[11] Patent Number: 5,239,695
[45] Date of Patent: * Aug. 24, 1993

[54] RADIO-FREQUENCY POWER CONTROL CIRCUIT OF MOBILE RADIOPHONE

[75] Inventor: Jae-Ik Jung, Daegu, Rep. of Korea

[73] Assignee: SamSung Electronics Cp., Ltd., Kyungdi, Rep. of Korea

[*] Notice: The portion of the term of this patent subsequent to Mar. 31, 2009 has been disclaimed.

[21] Appl. No.: 402,643

[22] Filed: Sep. 5, 1989

[30] Foreign Application Priority Data

Apr. 26, 1989 [KR] Rep. of Korea ................ 1989-5518

[51] Int. Cl.$^5$ ............................................. H04B 1/04
[52] U.S. Cl. ..................................... 455/126; 455/343
[58] Field of Search .................... 455/127, 343, 126; 307/243; 328/60, 61, 104, 139; 341/153

[56] References Cited

U.S. PATENT DOCUMENTS 3,914,696 10/1975 Evans .................................. 455/343

Primary Examiner—Reinhard J. Eisenzopf
Assistant Examiner—Edward Urban
Attorney, Agent, or Firm—Robert E. Bushnell

[57] ABSTRACT

Radio-frequency (RF) power control circuit that facilitates establishment of RF power levels of the mobile radiophone, is disclosed. The circuit maintains constant RF power levels even if the variable resistor is displaced by vibrations and impacts caused by moving of the mobile radiophone. The circuit includes an automatic gain control circuit for amplifying the RF power of the modulated signal from a modulator by comparing the RF power control voltage and the voltage of the power amplified RF signal, first voltage source of high level, second voltage source of low level, a switching circuit for selectively outputting the first and second voltages sources according to the logic control signal of a plurality of bits generated by a logic controller under control of a cell site, and a device for producing the RF power control voltage according to the first and second voltage sources by combination of resistors each having a given value, each of the output terminals of the switching circuit being connected with one of the resistors in series, the resistors connected with the switching circuit being connected with another resistor.

16 Claims, 3 Drawing Sheets

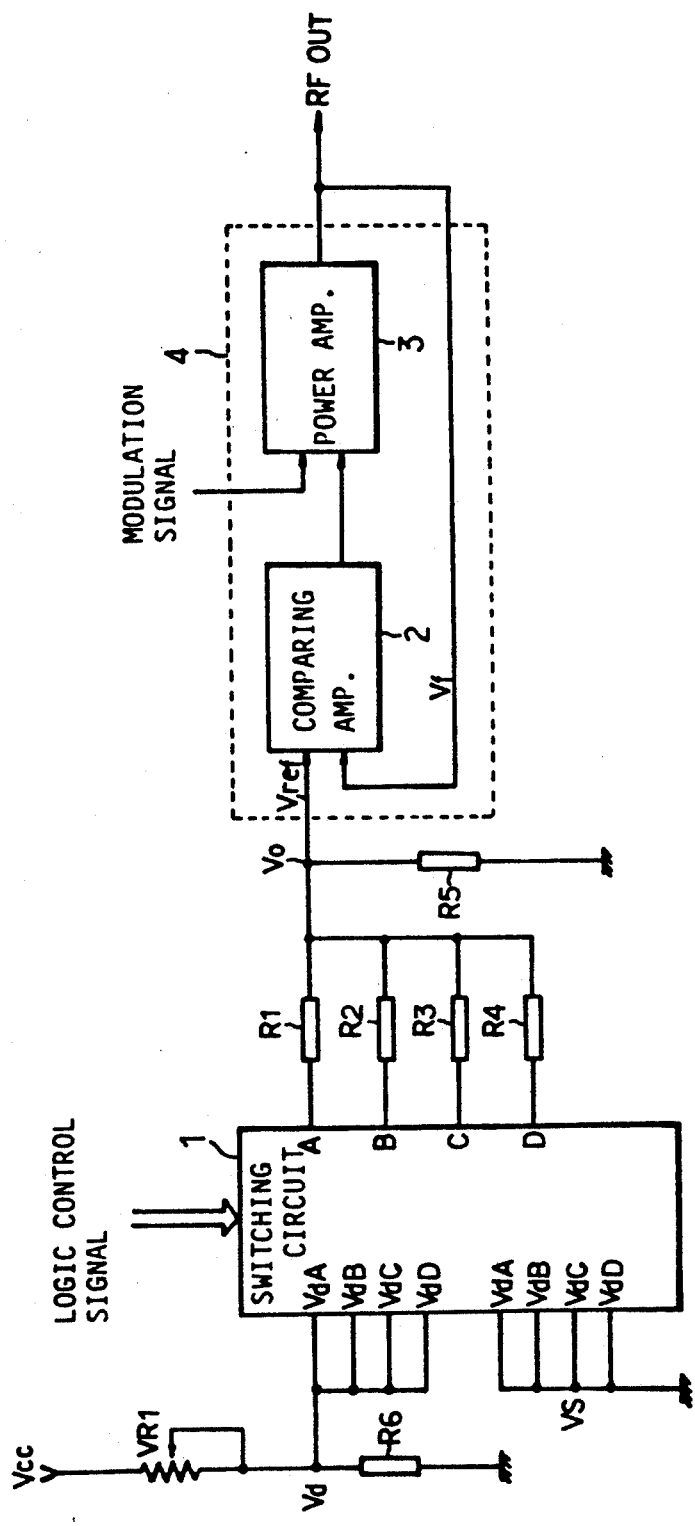
F I G. 2

RADIO-FREQUENCY POWER CONTROL CIRCUIT OF MOBILE RADIOPHONE

BACKGROUND OF THE INVENTION

The present invention relates to a mobile radiophone, and more particularly to a radio-frequency (RF) power control circuit of a transmitter in a mobile radiophone.

Generally, the mobile radiophone includes a vehicle radiophone (hereinafter referred to as car phone) and portable hand-held phone (hereinafter referred to as HHP). The mobile radio communication system for operating the car phone and HHP employs cellular radio communication method. The cellular radio communication method is to divide the whole service area into a plurality of sub-areas called cells and to employ a different frequency for each of the cells, in which if there is no frequency interference between the cells, the used frequency band is employed again to increase the communication efficiency and capability and to improve the communication quality. The known cellular communication method may be represented by the AMPS (Advanced Mobile Phone System) developed by the Bell Laboratory and ARTS (American Radio Telephone Service) developed by AJ & J.

A mobile radio communication system includes a mobile telephone switching office, cell sites, and mobile radiophones. The mobile telephone switching office communicates with the cell site on wire, while the cell site communication with the mobile radiophone is wireless. The mobile telephone switching office interconnects the wire telephone line network with the mobile radio communication system, and controls the channels allotted for the cell sites. The cell site controls various signals to deal with the wire telephone network in cooperation with the mobile telephone switching office, monitors the signal intensity of mobile radiophones within its own cell area to provide the information of the signal intensity to the mobile telephone switching office, and transfers to mobile radiophones the information received from the mobile telephone switching office. Thus, telephone subscribers connected with the mobile telephone switching office can communicate with mobile radiophones. If the power of the RF signal of the mobile radiophone near the cell site is increased, the communication sensitivity to the mobile radiophone distant from the cell site decreases. Hence, the cell site monitors the signal sensitivity of the mobile radiophone within its cell in order to adjust the signal sensitivity. The mobile radio telephone system prescribes the effective radiation power (ERP) according to the classes of the mobile radiophones in order to improve communication sensitivity, as shown in the following table 1.

TABLE 1

| Power Level (PL) | MAC | EIA Specification (Power Output and Power Control) ERP (dBw) according to Power Class | | |
|---|---|---|---|---|
| | | I | II | III |
| PL0 | 000 | 6 | 2 | −2 |
| PL1 | 001 | 2 | 2 | −2 |
| PL2 | 010 | −2 | −2 | −2 |
| PL3 | 011 | −6 | −6 | −6 |
| PL4 | 100 | −10 | −10 | −10 |
| PL5 | 101 | −14 | −14 | −14 |
| PL6 | 110 | −18 | −18 | −18 |
| PL7 | 111 | −22 | −22 | −22 |

Therefore, monitoring the signal sensitivity of the mobile radiophone, the cell site outputs the mobile attenuation code (MAC) signal of three bits in order to control the signal intensity, in response thereto. Receiving the MAC signal, the mobile radiophone radiates the RF signal for the Power Level of a given class. Power class is determined according to the classes of the mobile radiophone as shown in Table 1, for example, the car phone classified into class I, HHP classified into class III. Thus, the total number of the power levels of the car phone is 8, and each level is reduced by 4-dB starting from the highest level (PL0). On the other hand, the total number of the power levels of HHP is 6 (PL0-PL2 is common), and each level is reduced by 4-dB starting from the highest level (PL0-PL2).

Now, the conventional RF power control mechanism will be described with reference to FIG. 1. At first, the logic controller of the mobile radiophone, receiving the MAC signal from the cell site, generates a logic control signal. The logic control signals a,b and c have 8 states of 000-111 in binary code. According to the signals of the 8 states, analog multiplexer 11 sets the RF power levels PL0-PL7 as shown in Table 2.

TABLE 2

| a | b | c | Output |
|---|---|---|---|
| 0 | 0 | 0 | PL0 |
| 0 | 0 | 1 | PL1 |
| 0 | 1 | 0 | PL2 |
| 0 | 1 | 1 | PL3 |
| 1 | 0 | 0 | PL4 |
| 1 | 0 | 1 | PL5 |
| 1 | 1 | 0 | PL6 |
| 1 | 1 | 1 | PL7 |

After the power level specification (RF output measurement) as shown in Table is determined 1 variable resistors are adjusted to satisfy the power level specification, the power levels (PL0-PL7) as shown in Table 2 are set. For example, when setting the state of PL0, the variable resistor VR11 is adjusted to satisfy the power level specification (RF output measurement) of PL0. Then, because the state of PL1 is subordinated to the state of PL0, it may be set by resistors R12, R13. In this way, PL2, PL4 and PL6 are set and the variable resistors VR12, VR13, VR14 are then adjusted to meet the power level specification. Thereafter, it is confirmed that PL3, PL5, PL7 exist within their corresponding power level specification.

If the power levels PL1-PL7 are set as described above, the analog multiplexer 11 produces output voltage Vo for the given power level according to the logic control signal generated by the logic controller. The range of the output voltage Vo is determined by each element of automatic gain control (AGC) circuit 14, particularly by the differential driving operation of three-to-four-stage power amplifier 13 and the characteristics of the power amplifier 13. In the case of a mobile radiophone such as car phone and HHP, the output voltage Vo is about 0.5-4 volts.

The output voltage Vo of the analog multiplexer 11 drives the power amplifier 13 through a comparing amplifier 12 within AGC circuit 14. The power amplifier 13 amplifies the modulated signal (data+RF carrier-wave) received from the modulator of the mobile radiophone according to the output of the comparing amplifier 12 so as to output RF signal through antenna. Here, the output of the power amplifier 13 is fed back through a high-frequency coupling circuit, a rectifying circuit and a voltage dividing circuit within the AGC circuit 14 to one input of the comparing amplifier 12 as a comparing voltage Vf. Thus, the gain of the given voltage level chosen by the analog multiplexer 11 is automatically compensated, so that a constant voltage may be supplied to the power amplifier 13.

However, according to such a conventional RF power control method, in order to set each of six to eight power levels to the given power level specification, three to four variable resistors are adjusted and their subordinate power levels are set by resistors, thereby consuming. Further the power levels are set manually one by one. Therefore, if the value of a variable resistor deviates, the associated power level as well as the subordinate power level deviates from the specification, thereby resulting in difficulty in setting the power level. Especially, precise adjustment of the variable resistor is hardly achieved in the low power level, and vibrations and impacts caused by moving of the mobile radiophone easily cause change of the variable resistors, so that the power levels deviate from the desired specification, thereby impairing the reliability of the system.

SUMMARY OF THE INVENTION

It is an object of the present invention to provide an RF power control circuit which facilitates establishment of RF power levels of the mobile radiophone.

It is another object of the present invention to provide an RF control circuit which maintains constant RF power levels even if the variable resistor is displaced by vibrations and impacts caused by moving of the mobile radiophone.

It is still another object of the present invention to provide an RF power control circuit which facilitates expansion of the RF power levels of the mobile radiophone.

According to the present invention, an RF power control circuit of a mobile radiophone includes an automatic gain control circuit (AGC circuit) for amplifying the RF power of the modulated signal from a modulator by comparing the RF power control voltage and the voltage of the power amplified RF signal, first voltage source of high level, second voltage source of low level, a switching circuit for selectively outputting the first and second voltages sources according to the logic control signal of a plurality of bits generated by a logic controller under control of a cell site, and a device for producing the RF power control voltage according to the first and second voltage sources by combination of resistors each having a given value, each of the output terminals of said the switching circuit being connected with a resistor in series, the resistors connected with the switching circuit being connected with another resistor.

BRIEF DESCRIPTION OF THE ATTACHED DRAWINGS

For a better understanding of the invention and to show how the same may be carried into effect, reference will now be made, by way of example, to the accompanying diagrammatic drawings, in which:

FIG. 1 illustrates a conventional circuit;
FIG. 2 illustrates the inventive circuit; and
FIG. 3 illustrates an equivalent circuit of FIG. 2 for a specific logic control signal.

DETAILED DESCRIPTION OF THE PREFERRED EMBODIMENT

Referring to FIG. 2 illustrating the inventive circuit, voltage supplying terminal Vcc is connected with variable resistor VR1 and resistor R6 in series. The other end of the resistor R6 is grounded. According to a logic control signal of four bits generated by a logic controller (not shown) for controlling the whole functions of the mobile radiophone, a switching circuit selectively outputs through output terminals A,B,C,D a first voltage Vd generated between the variable resistor VR1 and resistor R6 and a second voltage Vs of ground level. To the output terminals A, B, C, D of the switching circuit 1 are respectively connected resistors R1 to R4 whose other ends are connected with another resistor R5 in common. The combination of resistors R1-R5 produces an RF power control voltage Vo according to the first and the second voltages Vd and Vs. Comparing amplifier 2 compares the RF power control voltage Vo with a feedback voltage Vf, also amplifying the compared voltage. A power amplifier 3 amplifies RF power of a modulate signal received from a modulator (not shown) according to output of the comparing amplifier circuit 2. FIG. 2 exemplifies the circuit for four-bit logic control signal. The number of input/output ports and resistors of the switching circuit 1 may be expanded as the bit number of the logic control signal increases.

Figure 1:
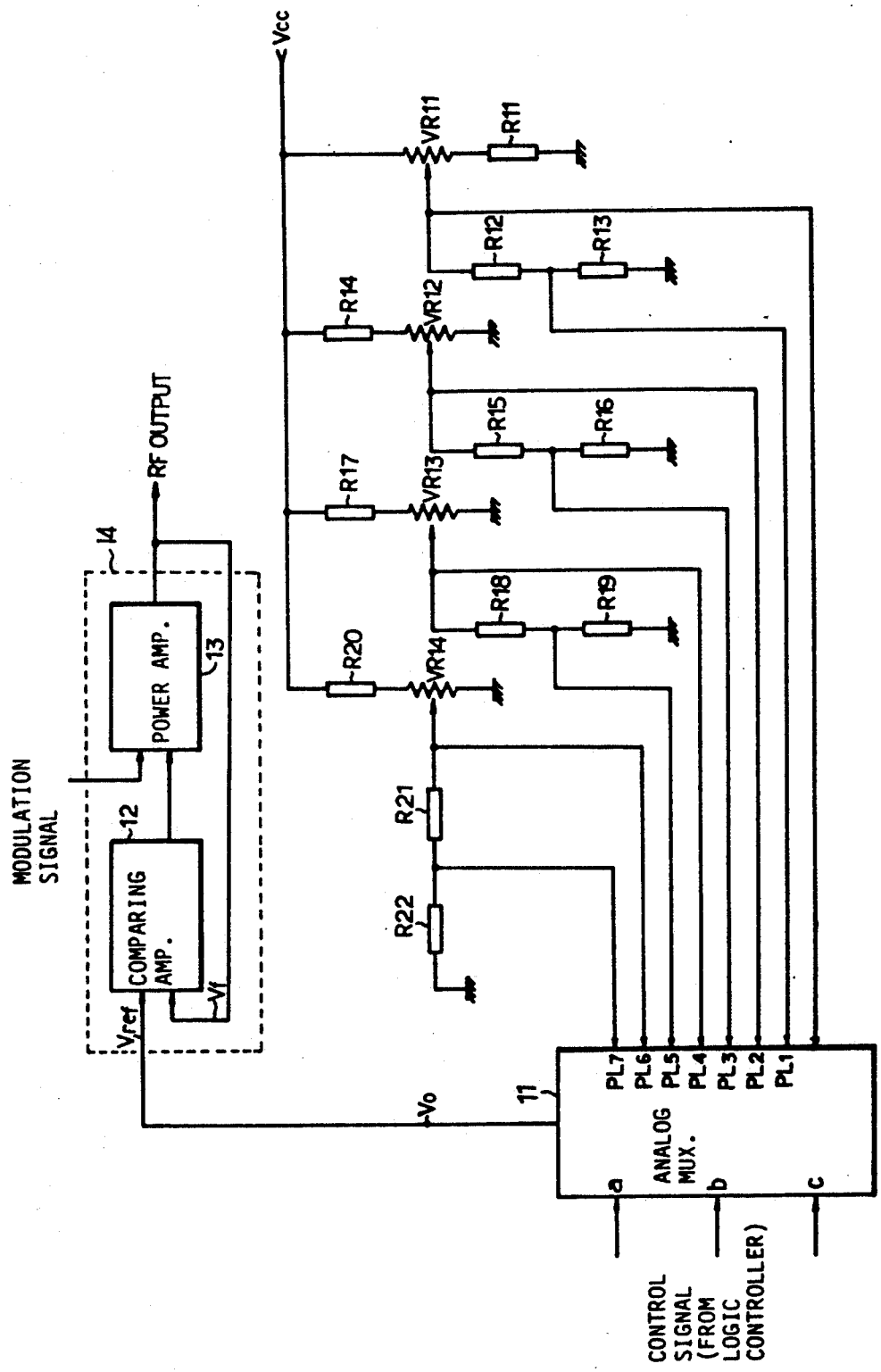
Figure 3:
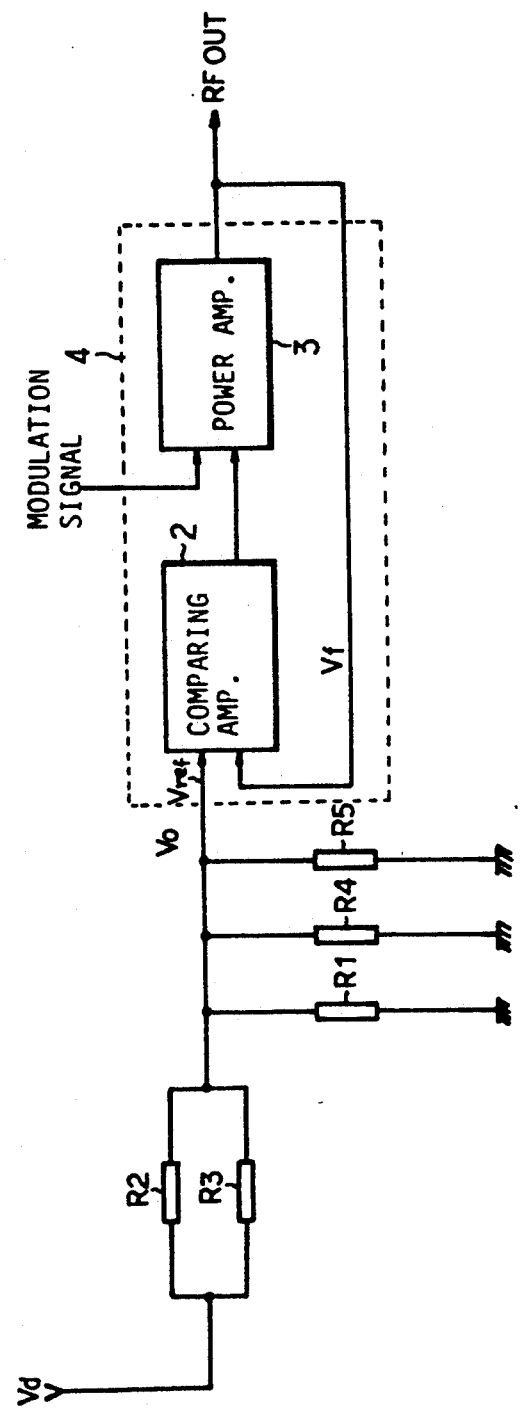

FIG. 3 is an equivalent circuit of FIG. 2 when the logic control signal is "0110" in binary number.

If the logic controller generates four-bit logic control signal, there are produced the RF power control levels of 15 states. Namely, the states from "0001" to "1111" except "0000" are set. Here, "0" indicates the second voltage Vs of low logic level, and "1" the first voltage Vd of high logic level. The first voltage Vd is obtained by dividing the supplying voltage Vcc generated from a 5 volts regulator (not shown) by variable resistor VR1 and resistor R6, and the second voltage Vs is of ground potential.

Hence, if the logic controller generates an arbitrary logic control signal of four bits, the switching circuit 1 is switched according to the logic control signal to selectively output the first voltage Vd or the second voltage Vs through the output terminals A, B, C and D. The outputs of the switching circuit are combined through resistors R1-R5 into the RF power control voltage Vo inputted into the comparing amplifier 2. For example, if the switching circuit 1 outputs A=0, B=1, C=1, D=0, the equivalent circuit is shown in FIG. 3, and Vo is given by the following equation (1). Here, "1" indicates the first voltage Vd, and "0" the second voltage Vs.

$$V_o = \frac{Vd \times (R1//R4//R5)}{(R2//R3) + (R1//R4//R5)} \quad (1)$$

The supplying voltage Vcc is varied through the variable resistor VR1 to produce the first voltage Vd whereby all the fifteen output levels may be precisely adjusted. Hence, if the value of the first voltage Vd is determined, it is set on a center value of variable resistor VR1. In this case, it is desirable that the first voltage Vd is set to finely vary (Vd=0.3 V) when the variable resistor VR1 is adjusted from the beginning to the end. The reason is that because the output voltage V0 of low power level (PL6, PL7) is finely controlled by the characteristics of the power amplifier 3, a large range of value of the first voltage Vd is not necessary, and even if the variable resistor VR1 is displaced due to vibrations and impacts caused by moving of the mobile radiophone, the output voltage should not deviate from the RF power level specification. Also, the RF power control levels of fifteen states are determined by the values of resistors R1–R5. Properly selecting the values of the resistors, the levels may be sequentially arranged from the level 1 (0001) to the level 15 (1111). For example, if the first voltage Vd is 4.5 V and the second voltage Vs if 0 V, and R1=10K, R2=20K, R3=39K, R4=80K and R5=56K, each in ohms, then the power levels of fifteen states are as shown in the following Table 3.

TABLE 3

| Logic Control Signal | A | B | C | D | Output Voltage |
|---|---|---|---|---|---|
| 1 | 0 | 0 | 0 | 1 | 0.273 |
| 2 | 0 | 0 | 1 | 0 | 0.560 |
| 3 | 0 | 0 | 1 | 1 | 0.833 |
| 4 | 0 | 1 | 0 | 0 | 1.092 |
| 5 | 0 | 1 | 0 | 1 | 1.365 |
| 6 | 0 | 1 | 1 | 0 | 1.652 |
| 7 | 0 | 1 | 1 | 1 | 1.925 |
| 8 | 1 | 0 | 0 | 0 | 2.184 |
| 9 | 1 | 0 | 0 | 1 | 2.458 |
| 10 | 1 | 0 | 1 | 0 | 2.745 |
| 11 | 1 | 0 | 1 | 1 | 3.018 |
| 12 | 1 | 1 | 0 | 0 | 3.277 |
| 13 | 1 | 1 | 0 | 1 | 3.550 |
| 14 | 1 | 1 | 1 | 0 | 3.837 |
| 15 | 1 | 1 | 1 | 1 | 4.110 |

As shown in Table 3, the output voltage Vo of the level 1 is 0.273 V, wherefrom it is sequentially increased to the level 15 of 4.110 V. Of course, the maximum and minimum value of the output voltage Vo and the voltage step difference between the levels are chosen by changing the first voltage Vd or the resistors R1 to R5. Thus, because the output voltage Vo is the reference voltage of the comparing amplifier 2 for determining the RF power level, if the first voltage Vd, the resistors R1–R5 and the component characteristic of AGC circuit 4 are combined according to the class of the mobile radiophone, the six to eight power levels PL specified in Table 1 (EIA specification 2.1.2.2) are chosen from the fifteen output voltages Vo as shown in Table 3. In this case, the logic controller should generate the logic control signal of four bits according to the MAC signal produced from the cell site, which may be easily performed by the internal program of the logic controller.

If the values as shown Table 3 are to be applied to HHP of the class III as shown in Table 1, the RF power levels are set as shown in the following Table 4.

TABLE 4

| Power Level (PL) | MAC (3 bits) | | | Logic Control Signal (4 bits) | Output | | | | Output Voltage Vo |
|---|---|---|---|---|---|---|---|---|---|
| | | | | | A | B | C | D | |
| 0 | 0 | 0 | 0 | 13 | 1 | 1 | 0 | 1 | 3.550 V |
| 1 | 0 | 0 | 1 | | | | | | |
| 2 | 0 | 1 | 0 | | | | | | |
| 3 | 0 | 1 | 1 | 10 | 1 | 0 | 1 | 0 | 2.745 V |
| 4 | 1 | 0 | 0 | 7 | 0 | 1 | 1 | 1 | 1.925 V |
| 5 | 1 | 0 | 1 | 5 | 0 | 1 | 0 | 1 | 1.365 V |
| 6 | 1 | 1 | 0 | 3 | 0 | 0 | 1 | 1 | 0.833 V |
| 7 | 1 | 1 | 1 | 2 | 0 | 0 | 1 | 0 | 0.560 V |

As shown in the Table 4, if the cell site produces the MAC signals (000, 001, 010) for the power levels (0,1,2), the logic controller generates the four-bit logic control signal "13" whereby the switching circuit 1 outputs the signals of A=1, B=1, C=0 and D=1, providing the output voltage Vref of 3.550 V to the comparing amplifier 2. Hence, the power amplifier 3 amplifies the RF carrier signal of the modulated wave according to the output of the comparing amplifier 2.

If the bit number of the logic control signal is to be increased in order to more precisely control the RF power, the input and output ports of the switching circuit 1 for the first and the second voltages may be expanded to the bit number of the logic control signal, and more resistors may be suitably connected with the output ports in series or in parallel.

As described above, according to the present invention, the RF power level may be easily adjusted because, during RF power controlling of the mobile radiophone, numerous power levels are produced so as to be selectively used. Furthermore, the first voltage source may be finely adjusted by using one variable resistor, so that the output level error caused by the error inherent in the component parts may be easily compensated, and even if the variable resistor is somewhat displaced due to vibrations and impacts caused by moving of the mobile radiophone, the output level is almost not varied, thereby improving the reliability and the quality of the product. Also, if the bit number of the logic control signal is to be increased, only the input/output ports of the switching circuit and resistors are expanded, so that the number of the power levels may be easily increased, and precise RF power level voltage is produced.

While the invention has been particularly shown and described with reference to a preferred embodiment, it will be understood by those skilled in the art that modifications in detail may be made without departing from the spirit and scope of the invention.

What is claimed is:

1. A radio-frequency power control circuit of a mobile radiophone having an automatic gain control circuit for generating a radio-frequency power control voltage to control a radio-frequency power according to a plurality of bits of a logic control signal supplied from a logic controller under control of a cell site and for amplifying the radio-frequency power of a modulated signal supplied from a modulator based on a comparison of the radio-frequency power control voltage and the power amplified radio-frequency voltage of the modulated signal, said circuit comprising:

a first voltage source producing a first voltage of logic high level;

a second voltage source producing a second voltage of logic low level;

a switching circuit for selectively choosing between said first and second voltages, based on corresponding bits of the logic control signal, and delivering the chosen voltages to respective output ports of said switching circuit; and means for producing the radio-frequency power control voltage for controlling said radio-frequency power, comprising:

a plurality of first resistors each having a given value according to said first and second voltage sources, and a first terminal of each of said plurality of resistors connected to a respective output ports of said switching circuit; and a second resistor connected at a common node to a second terminal of each of said plurality of first resistors.

2. A radio-frequency power control circuit of a mobile radiophone as claimed in claim 1, wherein said logic control signal has at least four bits.

3. A radio-frequency power control circuit of a mobile radiophone as claimed in claim 2, wherein said first voltage source is obtained by dividing a source supplying voltage by both a third variable resistor and a fourth resistor, said third variable resistor serving to finely adjust the radiofrequency power level.

4. A radio-frequency power control circuit of a mobile radiophone as claimed in claim 3, wherein said second voltage source is at ground potential.

5. A radio-frequency power control circuit of a mobile radiophone, comprising:
- a first voltage source producing a first voltage of logic high level;
- a second voltage source producing a second voltage of logic low level;
- a switching circuit for selectively choosing between said first and second voltages, based on corresponding bits of the logic control signal, and delivering the chosen voltages to respective output ports of said switching circuit;
- means for producing a radio-frequency power control voltage for controlling a radio-frequency power, comprising:
  - a plurality of first resistors each having a given value according to said first and second voltage sources, and a first terminal of each of said plurality of resistors being connected to a respective output port of said switching circuit; and
- automatic gain control means for generating a first signal to control a radio-frequency power, comprising:
  - means for comparing said radio-frequency power control voltage with a reference voltage and amplifying the result of the comparison to produce a compared voltage; and
  - amplifier means, coupled to receive the compared voltage from said comparing means and a modulated signal from a modulator, for amplifying the modulated signal based on the compared signal to generate a radio-frequency power control signal.

6. A radio-frequency power control circuit of a mobile radiophone as claimed in claim 5, wherein said logic control signal has at least four bits.

7. A radio-frequency power control circuit of a mobile radiophone as claimed in claim 6, wherein said first voltage source provides said first voltage by dividing a source supplying voltage by both a third variable resistor and a fourth resistor, said third variable resistor serving to finely adjust the radio-frequency power level.

8. A radio-frequency power control circuit of a mobile radiophone as claimed in claim 7, wherein said second voltage is at ground potential.

9. A radio-frequency power control circuit of a mobile radiophone, comprising:
- source means for producing a first voltage of logic high level and a second voltage of logic low level;
- a switching circuit for producing a first control signal composed of a the first and second voltages, based on a second logic control signal;
- intermediate means for producing a radio-frequency power control voltage for controlling radio-frequency power based on the first control signal; and
- automatic gain control means, coupled to receive the radio-frequency power control voltage, for generating a third signal to control the radio-frequency power.

10. A radio-frequency power control circuit of a mobile radiophone as claimed in claim 9, wherein said second logic control signal has at least four bits.

11. A radio-frequency power control circuit of a mobile radiophone as claimed in claim 10, wherein said intermediate means comprises:
- a plurality of first resistors each having a given value according to said first and second voltage sources, and a first terminal of each of said plurality of first resistors being connected to a respective output port of said switching circuit; and
- a second resistor connected to a common node with a second terminal of each of said plurality of first resistors.

12. A radio-frequency power control circuit of a mobile radiophone as claimed in claim 11, wherein said source means provides said first voltage source by dividing a source supplying voltage by both a third variable resistor and a fourth resistor, with said third variable resistor serving to finely adjust the radio-frequency power.

13. A radio-frequency power control circuit of a mobile radiophone as claimed in claim 12, wherein said second voltage is at ground potential.

14. A radio-frequency power control circuit of a mobile radiophone as claimed in claim 13, wherein said automatic gain control means comprise:
- means for comparing said radio-frequency power control voltage with a reference voltage and amplifying the result of the comparison to produce a compared voltage; and
- amplifier means, coupled to receive the compared voltage from said comparing means and a modulated signal, for amplifying the modulated signal based on the compared signal to produce the third signal.

15. A method for controlling the radio-frequency power of a mobile radio telephone, comprising the steps of:
- generating first high logic level and second low logic level signals;
- selectively choosing between said first and second logic level signals based on a third logic control signal to produce a fourth control signal;
- attenuating said fourth control signal to produce a first voltage;
- comparing said first voltage to a reference voltage to produce an intermediate signal;
- amplifying a modulation signal based on said intermediate signal to produce a seventh radio-frequency control signal.

16. A method as claimed in claim 15, further comprising the step of dividing a source supplying voltage by a variable resistor and a fixed value resistor to produce said first high logic level signal.

* * * * *

UNITED STATES PATENT AND TRADEMARK OFFICE
CERTIFICATE OF CORRECTION

PATENT NO. : 5,239,695
DATED : 24 August 1993
INVENTOR(S) : Jae-Ik Jung

It is certified that error appears in the above-indentified patent and that said Letters Patent is hereby corrected as shown below:

Column 1,

Line 31,     replace "communication" with --communicates--;

Column 2,

Line 36,     replace "Table is determined 1 variable" with --Table 1 is determined and variable--;

Column 3,

Line 12,     after "consuming", insert --much time--;

Column 4,

Line 10,     replace "switching circuit" with --switching circuit 1--;

UNITED STATES PATENT AND TRADEMARK OFFICE
CERTIFICATE OF CORRECTION

PATENT NO. : 5,239,695
DATED : 24 August 1993
INVENTOR(S) : Jae-Ik Jung

It is certified that error appears in the above-indentified patent and that said Letters Patent is hereby corrected as shown below:

Column 7,

Line 29,     after "resistors", insert --for producing a reference voltage--.

Signed and Sealed this

Twenty-seventh Day of September, 1994

Attest:

BRUCE LEHMAN

*Attesting Officer*      *Commissioner of Patents and Trademarks*